United States Patent
Yu et al.

(10) Patent No.: US 11,988,701 B2
(45) Date of Patent: May 21, 2024

(54) FAULT DIAGNOSIS METHOD FOR THREE-PHASE POWER GRID, APPARATUS, AND COMPUTER DEVICE

(71) Applicant: EAST GROUP CO., LTD., Guangdong (CN)

(72) Inventors: Wei Yu, Guangdong (CN); Jin Zhao, Guangdong (CN); Shaohui Li, Guangdong (CN)

(73) Assignee: EAST GROUP CO., LTD., Dongguan (CN)

( * ) Notice: Subject to any disclaimer, the term of this patent is extended or adjusted under 35 U.S.C. 154(b) by 0 days.

(21) Appl. No.: 17/760,445

(22) PCT Filed: Oct. 14, 2021

(86) PCT No.: PCT/CN2021/123771
§ 371 (c)(1),
(2) Date: Aug. 9, 2022

(87) PCT Pub. No.: WO2022/160778
PCT Pub. Date: Aug. 4, 2022

(65) Prior Publication Data
US 2023/0358798 A1    Nov. 9, 2023

(30) Foreign Application Priority Data
Feb. 1, 2021   (CN) .......................... 202110135189.5

(51) Int. Cl.
*G01R 31/08* (2020.01)
(52) U.S. Cl.
CPC ......... *G01R 31/086* (2013.01); *G01R 31/088* (2013.01)

(58) Field of Classification Search
CPC ................ G01R 31/086; G01R 31/088; G01R 19/2513; Y04S 10/52
USPC ......................................................... 324/522
See application file for complete search history.

(56) References Cited

U.S. PATENT DOCUMENTS 6,989,641 B2 *   1/2006   Schulz ............... G05B 19/4062
                                                            318/474

FOREIGN PATENT DOCUMENTS

| CN | 103065016 A | 4/2013 |
|---|---|---|
| CN | 203365558 U | 12/2013 |
| CN | 103795372 A | 5/2014 |
| CN | 108254654 A | 7/2018 |
| CN | 108321809 A | 7/2018 |
| CN | 108414821 A | 8/2018 |

(Continued)

*Primary Examiner* — Farhana A Hoque
(74) *Attorney, Agent, or Firm* — SHIMOKAJI IP (57) ABSTRACT

In the fault diagnosis method, apparatus, and computer device, the method includes acquiring line voltage values in real time according to a voltage collector connected to phase lines (S100); according to the line voltage values and preset system parameters, obtaining a voltage peak balance degree and a phase angle offset of the three-phase power grid (S200); and obtaining a fault diagnosis result according to the voltage peak balance degree and the phase angle offset (S300). In such a way, a real-time diagnosis operation of whether a three-phase power grid is balanced can be implemented only by performing on-line calculation and analysis on line voltage values, which has simple analysis operation to reduce the system complexity; and only a voltage collector is added, and no other hardware costs are required, moreover high diagnosis reliability is obtained.

8 Claims, 7 Drawing Sheets

(56) References Cited

FOREIGN PATENT DOCUMENTS

| | | | |
|---|---|---|---|
| CN | 108982949 | A | 12/2018 |
| CN | 109061384 | A | 12/2018 |
| CN | 109067147 | A | 12/2018 |
| CN | 109557398 | A | 4/2019 |
| CN | 110609181 | A | 12/2019 |
| CN | 111551824 | A | 8/2020 |
| CN | 112165264 | A | 1/2021 |
| CN | 112946421 | A | 6/2021 |
| WO | 2014/090816 | A1 | 6/2014 |

* cited by examiner

FAULT DIAGNOSIS METHOD FOR THREE-PHASE POWER GRID, APPARATUS, AND COMPUTER DEVICE

FIELD OF THE INVENTION

The present application relates to the technical field of power grid technology, and in particular to a fault diagnosis method, an apparatus, a computer device and a storage medium for a three-phase power grid.

BACKGROUND OF THE INVENTION

Whether a three-phase power grid is balanced is an extremely important indicator to measure the power quality. The factors that lead to three-phase unbalance include phase failure or unbalanced three-phase components, unbalanced parameters, and unbalanced load. Three-phase unbalance may cause phase voltage and current unbalance, resulting in changes in amplitude or phase angle, in which causes line loss, and even endangers the safe operation of the equipment connected to the power grid. With the future integration of new energy vehicle charging piles, energy storage power stations and other equipment into the grid, it will inevitably affect the power grid. Therefore, it is necessary and important to monitor whether the three phases of the power grid are balanced to control the power grid and power quality and ensure the normal and safe operation of the equipment.

A traditional diagnosis method of three-phase unbalance of power grid mainly analyzes the positive, negative and zero-sequence components, which needs to measure the magnitude and phase of each vector, resulting in complicated vector operations. Further, it's unavailable to calculate the phase angle by using power quality detection devices. Therefore, the traditional diagnosis method has poor diagnosis reliability.

SUMMARY OF THE INVENTION

In view of the above problems of poor diagnosis reliability, it is necessary to provide a fault diagnosis method, an apparatus, a computer device and a storage medium for a three-phase power grid.

A fault diagnosis method for a three-phase power grid includes acquiring line voltage values of the three-phase power grid, wherein the line voltage values are collected and sent in real time by a voltage collector connected to a phase line of the three-phase power grid; obtaining a voltage peak balance degree and a phase angle offset of the three-phase power grid based on the line voltage values and a preset system parameter; and obtaining a fault diagnosis result based on the voltage peak balance degree and the phase angle offset.

In one embodiment, the line voltage values comprise at least two of a first-phase line voltage value corresponding to a first phase, a second-phase line voltage value corresponding to a second phase, and a third-phase line voltage value corresponding to a third phase in the three-phase power grid.

In one embodiment, said obtaining a voltage peak balance degree and a phase angle offset of the three-phase power grid based on the line voltage values and a preset system parameter includes performing filtering analysis based on the line voltage values and the preset system parameter to obtain a filtered output line voltage value; and obtaining a voltage peak balance degree and a phase angle offset of the three-phase power grid based on the filtered output line voltage value.

In one embodiment, said obtaining a voltage peak balance degree and a phase angle offset of the three-phase power grid based on the filtered output line voltage value comprises obtaining a voltage peak value; and a phase voltage value, a phase angle value and a phase voltage peak value of a phase corresponding to the filtered output line voltage value, based on the filtered output line voltage value; obtaining a voltage peak balance degree based on the voltage peak value and the phase voltage peak value; and obtaining a phase angle offset based on the phase voltage value, the phase voltage peak value and the phase angle value.

In one embodiment, the line voltage values comprise a first-phase line voltage value and a second-phase line voltage value, and said performing filtering analysis based on the line voltage value and the preset system parameter to obtain a filtered output line voltage value comprises performing filter analysis based on the first-phase line voltage value and the preset system parameter to obtain a first-phase filtered output line voltage value; and performing filter analysis based on the second-phase line voltage value and the preset system parameter to obtain a second-phase filtered output line voltage value.

In one embodiment, said obtaining a voltage peak value; and a phase voltage value, a phase angle value and a phase voltage peak value of a phase corresponding to the filtered output line voltage value, based on the filtered output line voltage value comprises obtaining a phase angle value of a phase corresponding to the first-phase filtered output line voltage value based on the first-phase filtered output line voltage value; performing derivation to the first-phase filtered output line voltage value to obtain a processed first-phase filtered output line voltage value after derivation; obtaining a phase voltage peak value of a phase corresponding to the first-phase filtered output line voltage value, and a voltage peak value, based on the first-phase filtered output line voltage value and the processed first-phase filtered output line voltage value; and obtaining a phase voltage value of a phase corresponding to the first-phase filtered output line voltage value based on the voltage peak value and the second-phase filtered output line voltage value.

In one embodiment, said obtaining a fault diagnosis result based on the voltage peak balance degree and the phase angle offset comprises producing a detection result indicating an unbalanced three-phase power grid, once the voltage peak balance degree is not equal to 1 or the phase angle offset is not equal to 0; and producing a detection result indicating a balanced three-phase power grid, once the voltage peak balance degree is equal to 1 and the phase angle offset is equal to 0.

A fault diagnosis apparatus for a three-phase power grid includes a voltage acquisition module, configured to acquire line voltage values of the three-phase power grid, wherein the line voltage values are collected and sent in real time by a voltage collector connected to a phase line of the three-phase power grid; a parameter analysis module, configured to obtain a voltage peak balance degree and a phase angle offset of the three-phase power grid based on the line voltage values and a preset system parameter; and a fault analysis module, configured to obtain a fault diagnosis result based on the voltage peak balance degree and the phase angle offset.

A computer device includes a memory and a processor, wherein the memory is stored with computer programs, the processor is configured to execute the computer programs to implement steps of the above method.

A computer-readable storage medium, on which computer programs are stored, wherein the computer programs are configured to be executed by a processor to implement the steps of the method.

In the fault diagnosis method, the apparatus, the computer device and the computer-readable storage medium mentioned above, the line voltage values of the three-phase power grid can be obtained in real time by the voltage collector connected to the phase line of the three-phase power grid during the operation, the line voltage values obtained in real time and the preset system parameter are analyzed to a voltage peak balance degree and a phase angle offset of the three-phase power grid, and a fault diagnosis result is finally obtained based on the voltage peak balance degree and the phase angle offset. In such a way, a real-time diagnosis operation for judging whether the three-phase power grid is balanced can be realized, through the online calculation and analysis on the line voltage values, which has simple analysis operation to greatly reduce the system complexity. Meanwhile, the present solution only adds one or more voltage collectors on the hardware, and no other hardware cost is increased. Moreover, strong diagnostic reliability is obtained in the present solution.

DETAILED DESCRIPTION OF ILLUSTRATED EMBODIMENTS

In order to facilitate understanding of the present application, the present application will be described in further detail below with reference to the accompanying drawings. However, the application may be implemented in various different forms and is not limited to the embodiments described herein. On the contrary, it should be understood that the specific embodiments described herein are only used to explain the present application.

Figure 1:
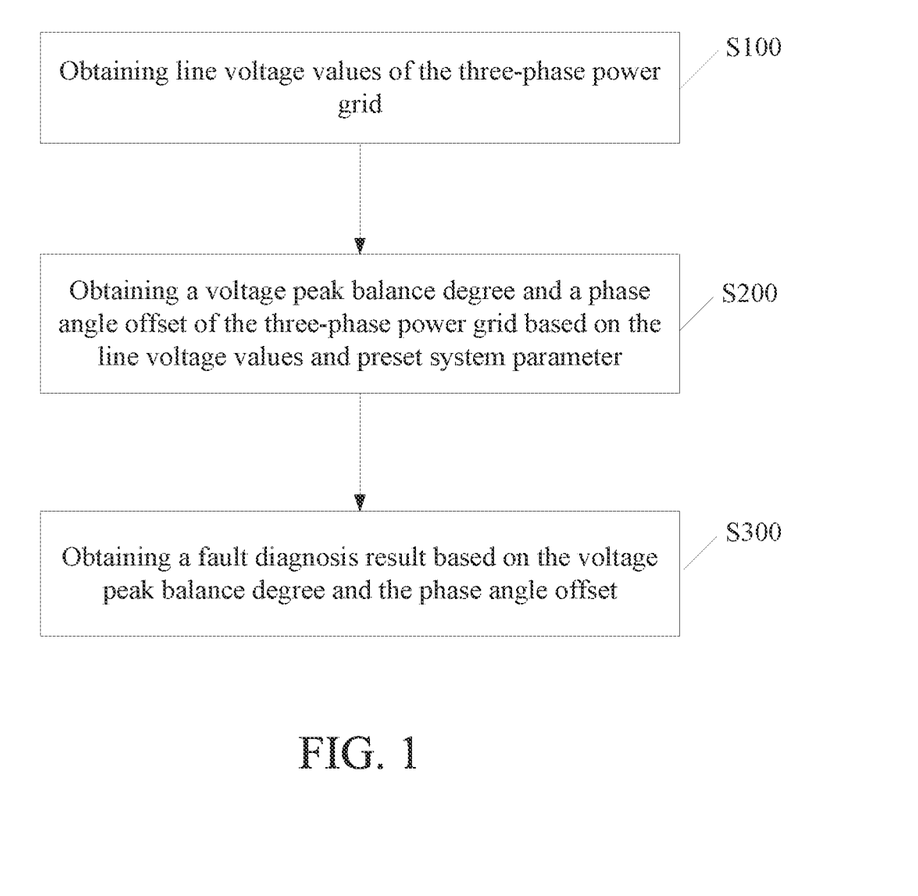
FIG. 1 is a schematic flowchart of a fault diagnosis method for a three-phase power grid according to an embodiment.

Referring to FIG. 1, a fault diagnosis method for a three-phase power grid includes Step S100, Step S200 and Step S300.

Step S100, acquiring line voltage values of the three-phase power grid.

Figure 2:
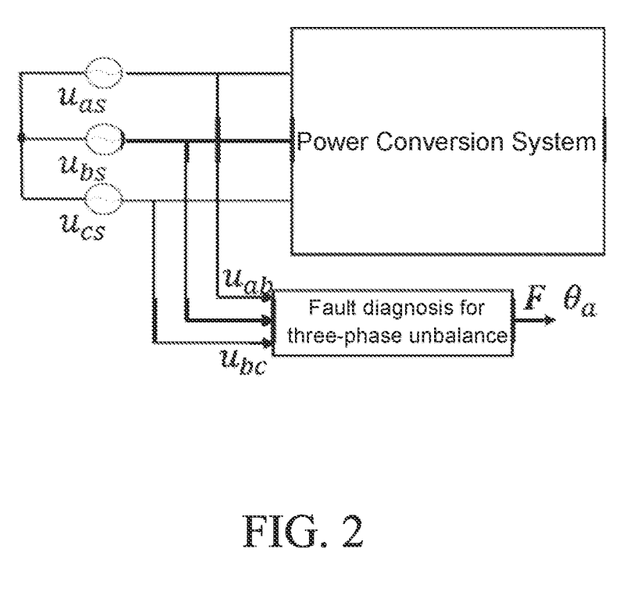
FIG. 2 is a framework structure of a system showing line voltage value sampling according to an embodiment.

Specifically, the line voltage values are collected and sent in real time by a voltage collector connected to a phase line of the three-phase power grid. A three-phase alternating current is a form of transmission of electric energy, and the three-phase alternating current power supply consists of three alternating current potentials with the same frequency, the equal amplitude and a phase difference of 120° from each other. Referring to FIG. 2, $u_{as}$, $u_{bs}$, $u_{cs}$ represent the voltages of three phases A, B, and C in the three-phase power grid, respectively, which are respectively transmitted to the back-end power conversion system through a phase line for power supply. In the present embodiment, a respective voltage collector can be connected to their respective phase lines of the three phases of A, B, and C, so as to collect their respective line voltage values $u_{ab}$, $u_{bc}$ and $u_{ac}$.

It can be understood that, the line voltage values are collected and sent by the voltage collector in real time, so that it can be diagnosed in time when a fault occurs in the three-phase power grid. For example, periodic sampling is carried out in real time with a short period of time. It should be noted that, the type of voltage collector is not unique. In one embodiment, a voltage sensor may be utilized, or other devices may also be chosen in other embodiments, as long as the line voltage values of the three-phase power grid can be collected and sent to the corresponding processor for analysis and processing.

Step S200, obtaining a voltage peak balance degree and a phase angle offset of the three-phase power grid based on the line voltage values and preset system parameter.

Specifically, the voltage peak balance degree is the degree of deviation between the phase voltage peak value of one phase of the three-phase power grid and the voltage peak value of the three-phase power grid, and the phase angle offset is the degree of deviation between the actual phase angle of one phase of the three-phase power grid and the phase angle value for that phase under normal conditions. As known, an unbalanced three-phase power grid will bring unbalanced three-phase voltage and unbalanced current, causing the amplitude and the phase angle to change. In view of this, a phase voltage peak value and a phase angle value of a certain phase are monitored in the present embodiment, which are used to detect and judge whether the three-phase power grid is balanced.

It can be understood that, the specific type of the preset system parameter is not unique. For example, in one embodiment, the preset system parameter may include at least one of frequency of the three-phase grid, sampling period of the voltage collector, filter cutoff frequency, and damping ratio. In particular, in a detailed embodiment, the frequency of the three-phase power grid, the sampling period of the voltage collector, the cutoff frequency of the filter and the damping ratio are served as the preset system parameters at the same time, which will be analyzed and calculated to obtain a real-time voltage peak balance degree and a real-time phase angle offset, after receiving the phase voltage values of the three-phase power grid.

Step S300, obtaining a fault diagnosis result based on the voltage peak balance degree and the phase angle offset.

Specifically, after analyzing and calculating the corresponding voltage peak balance degree and phase angle offset based on the preset system parameter and line voltage values, a fault detection result of whether the three-phase power grid is balanced in the current state can be intuitively obtained by comparing the current voltage peak balance degree, the current value of the phase angle offset, with a voltage peak balance degree and a phase angle offset when no fault occurs.

It can be understood that, the line voltage values of the three-phase power grid are not unique. In one embodiment, the line voltage values may include at least two of a first-phase line voltage value corresponding to a first phase, a second-phase line voltage value corresponding to a second phase, and a third-phase line voltage value corresponding to a third phase in the three-phase power grid.

Specifically, when analyzing and calculating the voltage peak balance degree and phase angle offset, line voltage values on at least two different phase lines need to be analyzed and calculated, and finally the voltage peak balance degree and the phase angle offset can be obtained. That is to say, at least two of the first-phase line voltage value, the second-phase line voltage value and the third phase line voltage value are utilized in this embodiment, and their respective voltage peak balance degrees and phase angle offsets corresponding to different phases are finally obtained, which all leads to the similar operations of fault diagnosis and analysis, namely analyzing the current voltage peak balance degree, the current value of the phase angle offset, with a voltage peak balance degree and a phase angle offset when no fault occurs.

Figure 3:
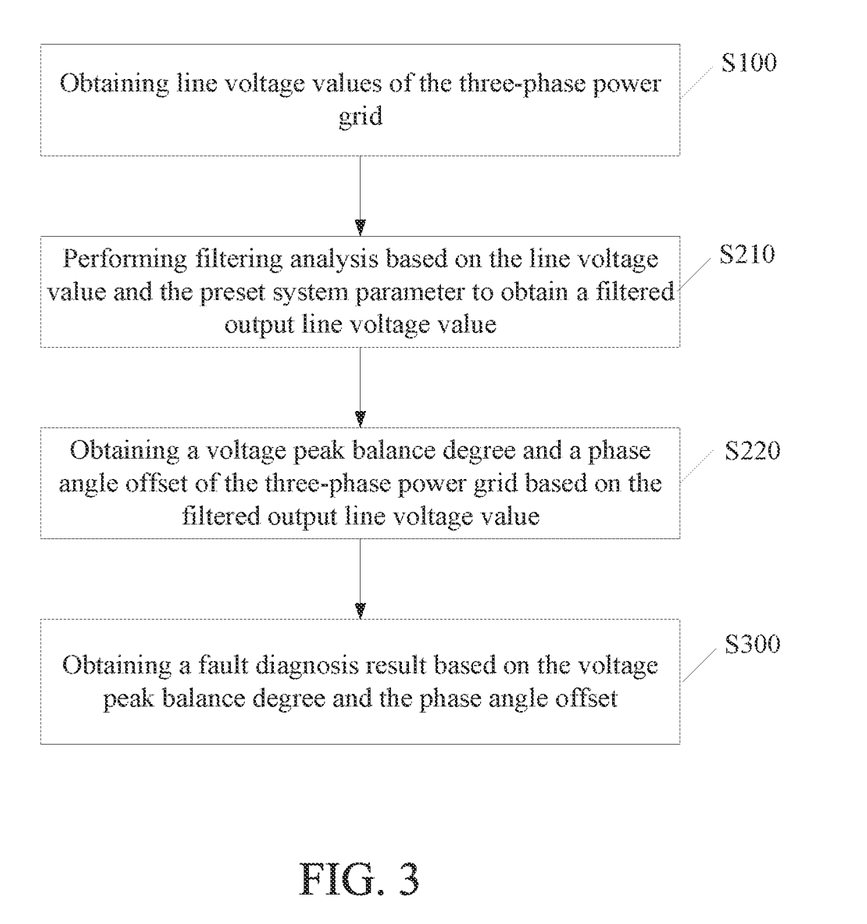
FIG. 3 is a schematic flowchart of a fault diagnosis method for a three-phase power grid according to another embodiment.

Referring to FIG. 3, in one embodiment, Step S200 includes Step S210 and Step 220.

Step S210, performing filtering analysis based on the line voltage value and the preset system parameter to obtain a filtered output line voltage value; and Step S220, obtaining a voltage peak balance degree and a phase angle offset of the three-phase power grid based on the filtered output line voltage value.

Specifically, in this embodiment, in order to ensure the accuracy of power grid fault analysis, the line voltage values of the three-phase power grid will be filtered after obtained, so as to make the line voltage signal more accurate. Such an accurate filtered output line voltage value will be used to calculate the voltage peak balance degree and phase angle offset.

Further, in one embodiment, second-order filtering processing is selected, and a time-domain open-loop transfer function used in the second-order filtering processing is $$G(s) = \frac{\omega_c^2}{s^2 + 2\xi\omega_c s + \omega_c^2},$$

wherein $\omega_c$ represents a cutoff frequency of the filter, $\xi$ represents a damping ratio, $\omega_c$ is equal to $2\pi f$, and $\xi$ is equal to 0.707.

Figure 4:
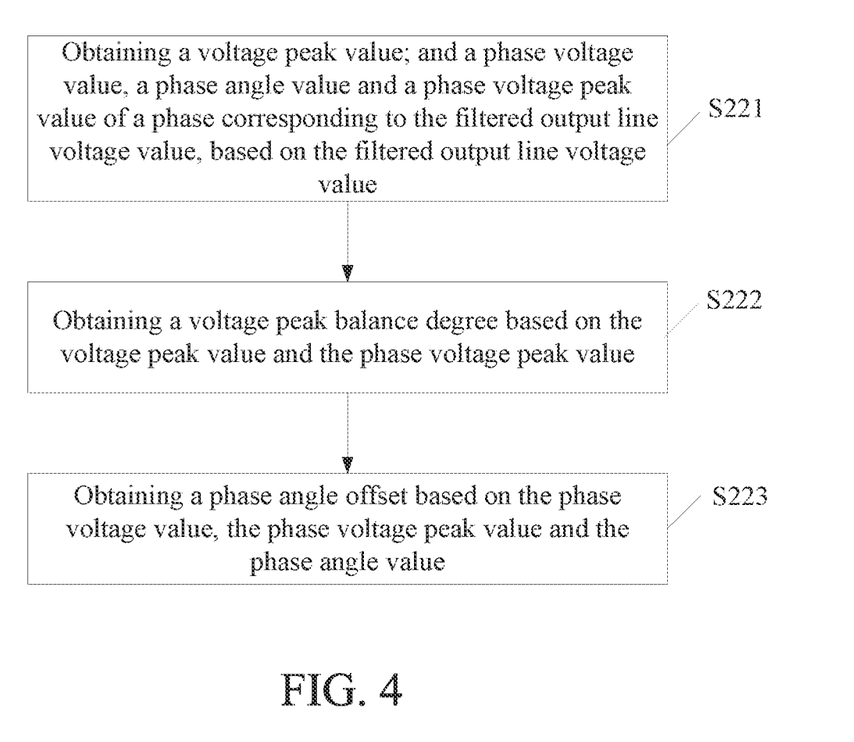
FIG. 4 is a schematic flowchart of calculating the voltage peak balance degree and the phase angle offset according to an embodiment.

Referring to FIG. 4, in one embodiment, Step S220 includes Step S221, Step S222 and Step S223.

Step S221, obtaining a voltage peak value; and a phase voltage value, a phase angle value and a phase voltage peak value of a phase corresponding to the filtered output line voltage value, based on the filtered output line voltage value; Step S222, obtaining a voltage peak balance degree based on the voltage peak value and the phase voltage peak value; Step S223, obtaining a phase angle offset based on the phase voltage value, the phase voltage peak value and the phase angle value.

Specifically, in this embodiment, after the line voltage value is obtained, the line voltage value and the characteristics of the three-phase power grid are analyzed and calculated to directly obtain the voltage peak value of the three-phase power grid in the current state, and the phase voltage value, the phase angle value and the phase voltage peak value of the corresponding phase of the filtered output line voltage value, and then the voltage peak balance degree and phase angle offset in the three-phase power grid in the current state can be intuitively obtained by combining and analyzing the above-obtained parameters.

It should be pointed out that, the calculation methods of the voltage peak balance degree and the phase angle offset are not unique, as long as it can reasonably represent the degree of deviation between the voltage peak value of a corresponding phase and the voltage peak value of the three-phase power grid, and the degree of deviation between an actual phase angle value of a certain phase and a voltage phase angle under normal conditions. For example, in one embodiment, a ratio is used to represent the degree of deviation between the voltage peak value of a certain phase and the voltage peak value of the three-phase power grid, and a difference method is used to analyze the degree of deviation between the actual phase angle value of a certain phase and the voltage phase angle under normal conditions.

Correspondingly, in a detailed embodiment, $$F = \frac{U_a}{U_m}, \text{ and } \theta_a = \arcsin\left(\frac{u_a}{U_a}\right) - \theta,$$

wherein F represents a voltage peak balance degree, $U_a$ represents a phase voltage peak value of the corresponding phase of the filtered output line voltage value, $U_m$ represents a voltage peak value of the three-phase power grid, $\theta_a$ represents a phase angle offset, $u_a$ represents a voltage value of the corresponding phase of the filtered output line voltage value, and $\theta$ represents a phase angle value of a corresponding phase of the filtered output line voltage value under a normal condition.

Figure 5:
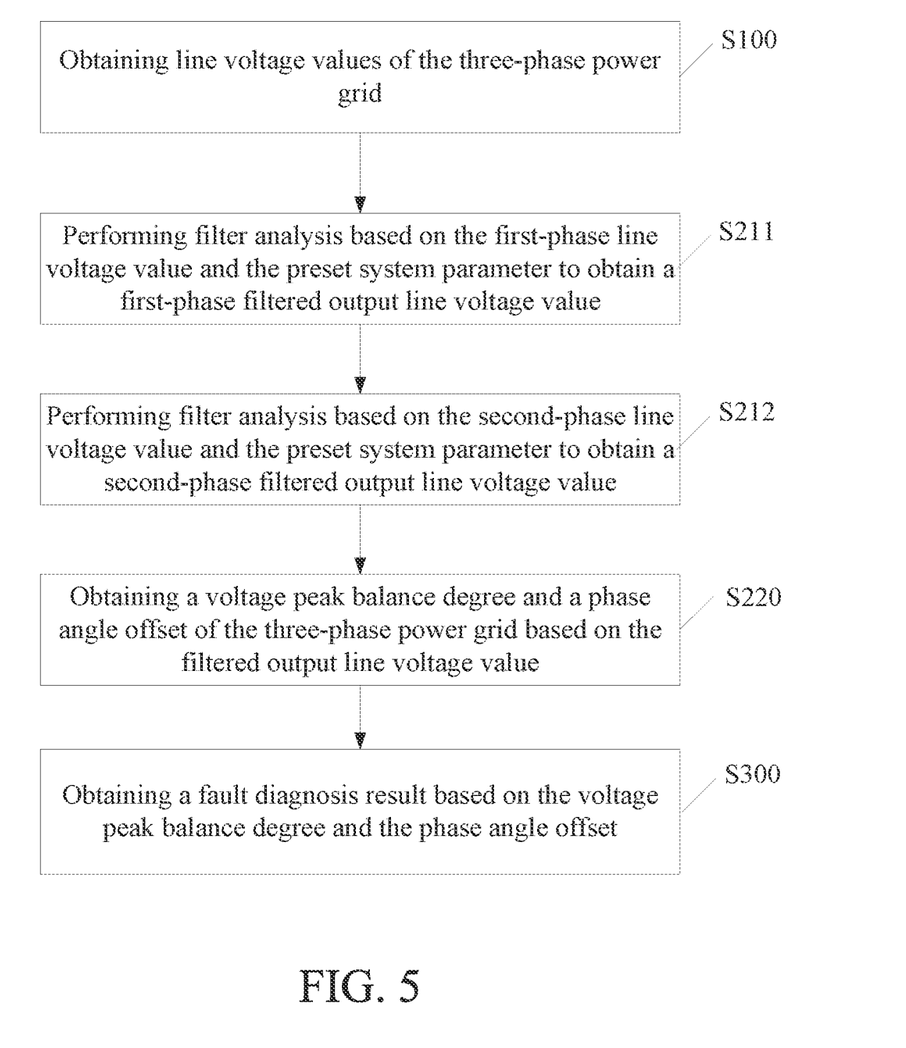
FIG. 5 is a schematic flowchart of a fault diagnosis method for a three-phase power grid according to another embodiment.

Referring to FIG. 5, in one embodiment, the line voltage values include a first-phase line voltage value and a second-phase line voltage value, and Step S210 includes Step S211 and Step S222.

Step S211, performing filter analysis based on the first-phase line voltage value and the preset system parameter to obtain a first-phase filtered output line voltage value; and Step S212, performing filter analysis based on the second-phase line voltage value and the preset system parameter to obtain a second-phase filtered output line voltage value.

Specifically, in this embodiment, the line voltage values include two line voltage values corresponding to two different phases for explanation. Correspondingly, in order to acquire the first-phase line voltage value and the second-phase line voltage value, a respective voltage collector is connected to the phase lines that correspond to the first phase and the second phase in the three-phase power grid, so as to collect and send the first-phase and the second-phase line voltage values which are then proceeded with second-order filtering processing to finally obtain the first-phase filtered output line voltage value and the second-phase filtered output line voltage value.

In order to facilitate the understanding of the technical solution of this embodiment, the time-domain open-loop transfer function in the second-order filtering processing is $$G(s) = \frac{\omega_c^2}{s^2 + 2\xi\omega_c s + \omega_c^2},$$

wherein $\omega_c$ represents a cutoff frequency of the filter, and $\xi$ represents a damping ratio, $\omega_c$ is equal to $2\pi f$, and $\xi$ is equal to 0.707. Different filtered output line voltage values are obtained depending on different line voltage values, as follows:

$$u_{abf(n)} = \frac{b_0(u_{ab(n)} + 2u_{ab(n-1)} + u_{ab(n-2)}) - a_1 u_{abf(n-1)} - a_2 u_{abf(n-2)}}{a_0};$$

$$u_{bcf(n)} = \frac{b_0(u_{bc(n)} + 2u_{bc(n-1)} + u_{bc(n-2)}) - a_1 u_{bcf(n-1)} - a_2 u_{bcf(n-2)}}{a_0}.$$

In the present embodiment, the line voltage values are collected in real time, by voltage collectors.

For example, $b_0 = \omega_c^2 * T_s^2$, $a_0 = 4 + 4*\xi*\omega_c*T_s + b_0$, $a_1 = -8 + 2*b_0$, $a_2 = 4 - 4*\xi*\omega_c*T_s + b_0$, wherein $u_{abf(n)}$ represents the nth $u_{abf}$ point, $u_{ab(n)}$ represents the nth $u_{ab}$ point, $u_{bcf(n)}$ represents the nth $u_{bcf}$ point, $u_{bc(n)}$ represents the nth $u_{bc}$ point, $u_{ab}$ represents a second-phase line voltage value, $u_{bc}$ represents a first-phase line voltage value, $u_{abf}$ represents a second-phase filtered output line voltage value, $u_{bcf}$ represents a first-phase filtered output line voltage value, and $T_s$ represents a sampling period of the voltage collector.

Correspondingly, in one embodiment, Step S221 includes: obtaining a phase angle value of a phase corresponding to the first-phase filtered output line voltage value based on the first-phase filtered output line voltage value; performing derivation to the first-phase filtered output line voltage value to obtain a processed first-phase filtered output line voltage value after derivation; obtaining a phase voltage peak value of a phase corresponding to the first-phase filtered output line voltage value, and a voltage peak value, based on the first-phase filtered output line voltage value and the processed first-phase filtered output line voltage value; and obtaining a phase voltage value of a phase corresponding to the first-phase filtered output line voltage value based on the voltage peak value and the second-phase filtered output line voltage value.

Specifically, after the first-phase and the second-phase filtered output line voltage values are obtained, a derivation calculation is performed on $u_{bcf}$ to obtain a derivative $u_{bcf}'$, and then the voltage peak value $U_m$ of the three-phase power grid can be calculated and obtained according to the formula $$U_m = \sqrt{\frac{u_{bcf}'^2}{3(2\pi f)^2} + \frac{u_{bcf}^2}{3}};$$

the phase voltage peak value $U_a$ of the corresponding phase of the first-phase filtered output line voltage value can be calculated and obtained according to the formula $$U_a = \sqrt{\frac{u_{bcf}'^2}{3(2\pi f)^2} + \frac{u_{bcf}^2}{3}};$$

the phase angle value $\theta$ of the corresponding phase of the first-phase filtered output line voltage value can be calculated and obtained according to the formula $$\theta = \arccos\left(-\frac{u_{bcf}}{\sqrt{3}}\right);$$

while the phase voltage value of the corresponding phase of the first-phase filtered output line voltage value $u_a$ can be calculated and obtained according to the formula $$u_a = u_{abf} + U_m \sin\left(\varphi - \frac{2}{3}\pi\right).$$

After that, it is only necessary to put the values of $U_m$, $U_a$, $\theta$, $u_a$ into the formulas $$F = \frac{U_a}{U_m}, \text{ and } \theta_a = \arcsin\left(\frac{u_a}{U_a}\right) - \theta$$

in the above embodiment to perform the final analysis calculation, the final voltage peak balance degree and phase angle offset will be directly obtained. At this time, a detection result of whether the current three-phase power grid is balanced (that is, whether it is faulty) can be produced when the processor analyzes and processes the voltage peak balance degree and phase angle offset obtained above.

Figure 6:
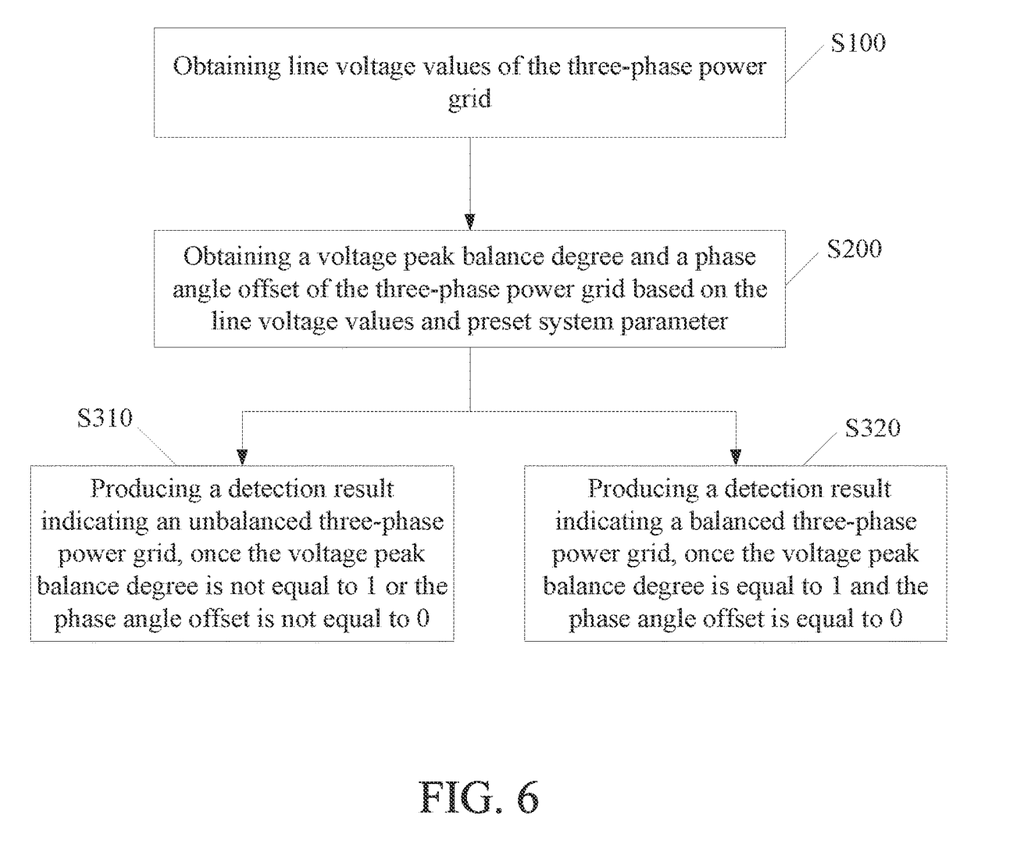
FIG. 6 is a is a schematic flowchart of a fault diagnosis method for a three-phase power grid according to still another embodiment.

It can be understood that, the fault diagnosis method based on the voltage peak balance degree and the phase angle offset is not unique. Referring to FIG. 6, in one embodiment, Step S300 includes Step S310 and Step S320.

Step S310, producing a detection result indicating an unbalanced three-phase power grid, once the voltage peak balance degree is not equal to 1 or the phase angle offset is not equal to 0; Step S320, producing a detection result indicating a balanced three-phase power grid, once the voltage peak balance degree is equal to 1 and the phase angle offset is equal to 0.

Specifically, in this embodiment, a ratio is used to represent the degree of deviation between the voltage peak value of a certain phase and the voltage peak value of the three-phase power grid, and a difference method is used to analyze the degree of deviation between the actual phase angle value of a certain phase and the voltage phase angle under normal conditions. At this time, $$F = \frac{U_a}{U_m},$$

the values of $U_a$ and $U_m$ should be the same, namely $U_a/U_m$ should be equal to 1 under normal conditions; once the value of $U_a/U_m$ is not equal to 1, the three-phase power grid is under an unbalanced state. Similarly, the phase angle value calculated according to $U_a$ and $u_a$ should be consistent with the phase angle value $\theta$ under normal conditions, thus the value of arcsin $$\left(\frac{u_a}{U_a}\right) - \theta$$

should be equal to zero when the three-phase power grid is in a balanced state; otherwise (that is, the phase angle offset is not equal to zero), the three-phase power grid is in an unbalanced state. In this embodiment, the voltage peak balance degree is directly compared with 1, and the phase angle offset is compared with 0, by which a corresponding diagnosis result is produced.

It should be understood that, steps in the flowcharts of FIGS. 1 and 3-5 are not necessarily executed in the sequence shown by the arrows. Unless explicitly stated herein, the execution of these steps is not strictly limited to this order, and also may be in other orders. Moreover, at least a part of the steps in FIGS. 1 and 3-5 may include multiple steps or multiple stages. These steps or stages are not necessarily executed and completed at the same time, but may be executed at different times. The order of the execution of these steps or stages is also not necessarily sequential, but may be performed alternately with other steps or at least a portion of the steps or phases within the other steps.

In the fault diagnosis method for a three-phase power grid mentioned above, the line voltage values of the three-phase power grid can be obtained in real time by the voltage collector connected to the phase line of the three-phase power grid during the operation, the line voltage values obtained in real time and the preset system parameter are analyzed to a voltage peak balance degree and a phase angle offset of the three-phase power grid, and a fault diagnosis result is finally obtained based on the voltage peak balance degree and the phase angle offset. In such a way, a real-time diagnosis operation for judging whether the three-phase power grid is balanced can be realized, through the online calculation and analysis on the line voltage values, which has simple analysis operation to greatly reduce the system complexity. Meanwhile, the present method only adds one or more voltage collectors on the hardware, and no other hardware cost is increased. Moreover, strong diagnostic reliability is obtained in the present method.

Figure 7:
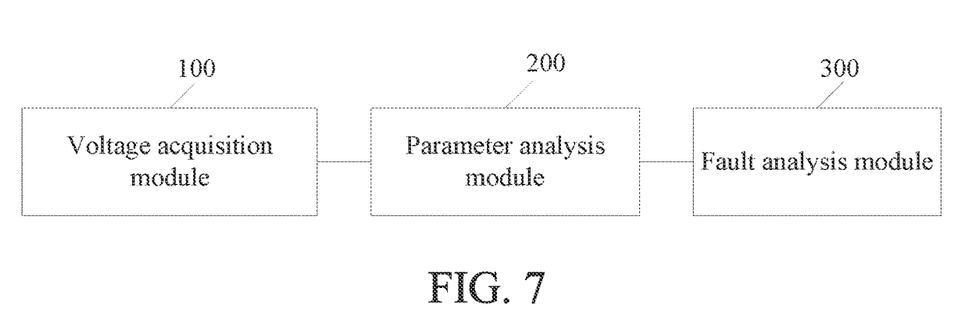
FIG. 7 is a schematic structural diagram of a fault diagnosis apparatus for a three-phase power grid according to an embodiment.

Referring to FIG. 7, a fault diagnosis apparatus for a three-phase power grid includes a voltage acquisition module 100, a parameter analysis module 200 and a fault analysis module 300.

The voltage acquisition module 100 is configured to acquire line voltage values of the three-phase power grid; the parameter analysis module 200 is configured to obtain a voltage peak balance degree and a phase angle offset of the three-phase power grid based on the line voltage values and preset system parameter; and the fault analysis module 300 is configured to obtain a fault diagnosis result based on the voltage peak balance degree and the phase angle offset.

In one embodiment, the parameter analysis module 200 is further configured to perform filtering analysis based on the line voltage value and the preset system parameter to obtain a filtered output line voltage value; and obtain a voltage peak balance degree and a phase angle offset of the three-phase power grid based on the filtered output line voltage value.

In one embodiment, the parameter analysis module 200 is further configured to obtain a voltage peak value; and a phase voltage value, a phase angle value and a phase voltage peak value of a phase corresponding to the filtered output line voltage value, based on the filtered output line voltage value; obtain a voltage peak balance degree based on the voltage peak value and the phase voltage peak value; and obtain a phase angle offset based on the phase voltage value, the phase voltage peak value and the phase angle value.

In one embodiment, the parameter analysis module 200 is further configured to perform filter analysis based on the first-phase line voltage value and the preset system parameter to obtain a first-phase filtered output line voltage value; and perform filter analysis based on the second-phase line voltage value and the preset system parameter to obtain a second-phase filtered output line voltage value.

In one embodiment, the parameter analysis module 200 is further configured to obtain a phase angle value of a phase corresponding to the first-phase filtered output line voltage value based on the first-phase filtered output line voltage value; obtain a phase voltage peak value of a phase corresponding to the first-phase filtered output line voltage value, and a voltage peak value, based on the first-phase filtered output line voltage value and the processed first-phase filtered output line voltage value; and obtain a phase voltage value of a phase corresponding to the first-phase filtered output line voltage value based on the voltage peak value and the second-phase filtered output line voltage value.

In one embodiment, the fault analysis module 300 is further configured to produce a detection result indicating an unbalanced three-phase power grid, when the voltage peak balance degree is not equal to 1 or the phase angle offset is not equal to 0; and produces a detection result indicating a balanced three-phase power grid, when the voltage peak balance degree is equal to 1 and the phase angle offset is equal to 0.

Specific limitations on the fault diagnosis apparatus may be referred to the above-mentioned limitations on the fault diagnosis method, which are not repeated here. All or part of each module in the above-mentioned fault diagnosis apparatus can be implemented by software, hardware, or a combination thereof. Said each module can be embedded in or independent of a processor in a computer device in the form of hardware; or stored in a memory in the computer device in the form of software, so that the processor can call and execute the operations corresponding to each module.

In the fault diagnosis apparatus for a three-phase power grid mentioned above, the line voltage values of the three-phase power grid can be obtained in real time by the voltage collector connected to the phase line of the three-phase power grid during the operation, the line voltage values obtained in real time and the preset system parameter are analyzed to a voltage peak balance degree and a phase angle offset of the three-phase power grid, and a fault diagnosis result is finally obtained based on the voltage peak balance degree and the phase angle offset. In such a way, a real-time diagnosis operation for judging whether the three-phase power grid is balanced can be realized, through the online calculation and analysis on the line voltage values, which has simple analysis operation to greatly reduce the system complexity. Meanwhile, the present apparatus only adds one or more voltage collectors on the hardware, and no other hardware cost is increased. Moreover, strong diagnostic reliability is obtained in the present apparatus.

Figure 8:
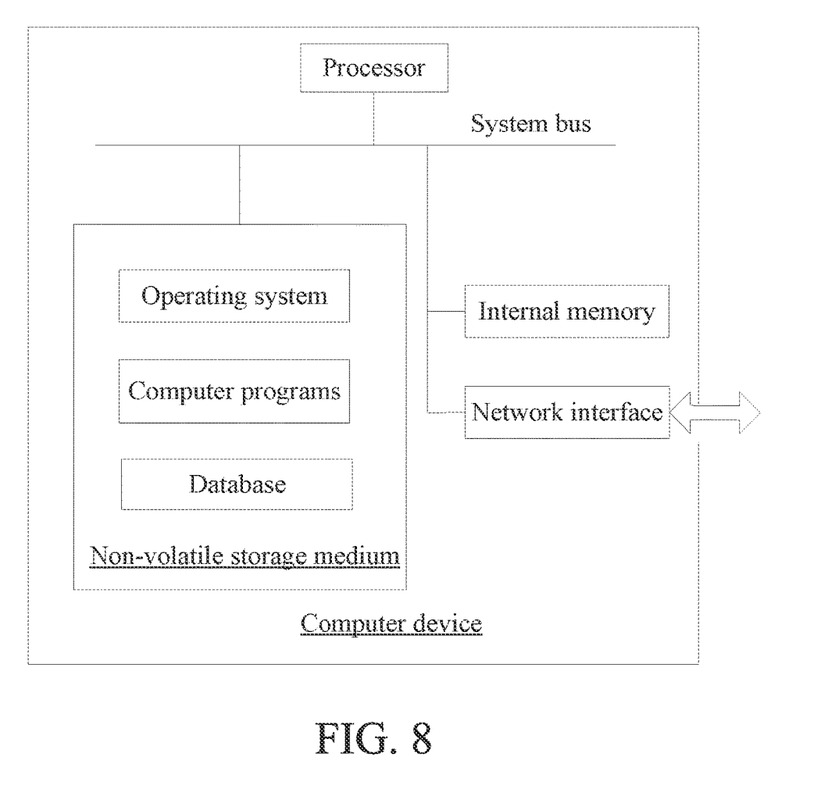
FIG. 8 is an internal schematic structural diagram of a computer device according to an embodiment.

In one embodiment, a computer device is provided, which may be a server, and has an internal structure diagram as shown in FIG. 8. The computer device includes a processor, a memory, a network interface, and a database connected by a system bus. Specifically, the processor of the computer device is used to provide computing and control capabilities. The memory of the computer device may include a non-volatile storage medium and an internal memory. The non-volatile storage medium is stored with an operating system, computer programs, and a database. The internal memory is configured to provide an environment for the execution of the operating system and computer programs in the non-volatile storage medium. The database of the computer device is configured to store preset system parameter data. The network interface of the computer device is configured to communicate with an external terminal through a network connection. The computer programs are configured to implement a fault diagnosis method for a three-phase power grid when executed by the processor.

Those skilled in the art can understand that, the structure shown in FIG. 8 is only a block diagram of a partial structure related to the solution of the present application, which does not limit the present application. A specific computer device may include more or fewer components than shown in the figure, or combine certain components, or have different arrangements.

In one embodiment, a computer device is provided, which includes a memory and a processor, wherein the memory is configured to store computer programs, and the processor is configured to execute the computer programs to implement the following steps: acquiring line voltage values of the three-phase power grid; obtaining a voltage peak balance degree and a phase angle offset of the three-phase power grid based on the line voltage values and preset system parameter; and obtaining a fault diagnosis result based on the voltage peak balance degree and the phase angle offset.

In one embodiment, the processor is further configured to implement the following steps when executing the computer programs: performing filtering analysis based on the line voltage value and the preset system parameter to obtain a filtered output line voltage value; and obtaining a voltage peak balance degree and a phase angle offset of the three-phase power grid based on the filtered output line voltage value.

In one embodiment, the processor is further configured to implement the following steps when executing the computer programs: obtaining a voltage peak value; and a phase voltage value, a phase angle value and a phase voltage peak value of a phase corresponding to the filtered output line voltage value, based on the filtered output line voltage value; and obtaining a voltage peak balance degree based on the voltage peak value and the phase voltage peak value; and obtaining a phase angle offset based on the phase voltage value, the phase voltage peak value and the phase angle value.

In one embodiment, the processor is further configured to implement the following steps when executing the computer programs: performing filter analysis based on the first-phase line voltage value and the preset system parameter to obtain a first-phase filtered output line voltage value; and performing filter analysis based on the second-phase line voltage value and the preset system parameter to obtain a second-phase filtered output line voltage value.

In one embodiment, the processor is further configured to implement the following steps when executing the computer programs: obtaining a phase angle value of a phase corresponding to the first-phase filtered output line voltage value based on the first-phase filtered output line voltage value; performing derivation to the first-phase filtered output line voltage value to obtain a processed first-phase filtered output line voltage value after derivation; obtaining a phase voltage peak value of a phase corresponding to the first-phase filtered output line voltage value, and a voltage peak value, based on the first-phase filtered output line voltage value and the processed first-phase filtered output line voltage value; and obtaining a phase voltage value of a phase corresponding to the first-phase filtered output line voltage value based on the voltage peak value and the second-phase filtered output line voltage value.

In one embodiment, the processor is further configured to implement the following steps when executing the computer programs: producing a detection result indicating an unbalanced three-phase power grid, once the voltage peak balance degree is not equal to 1 or the phase angle offset is not equal to 0; and producing a detection result indicating a balanced three-phase power grid, once the voltage peak balance degree is equal to 1 and the phase angle offset is equal to 0.

In one embodiment, a computer-readable storage medium is further provided, which is stored with computer programs configured to be executed by a processor to implement the following steps: acquiring line voltage values of the three-phase power grid; obtaining a voltage peak balance degree and a phase angle offset of the three-phase power grid based on the line voltage values and preset system parameter; and obtaining a fault diagnosis result based on the voltage peak balance degree and the phase angle offset.

In one embodiment, the computer programs are configured to be executed to implement the following steps: performing filtering analysis based on the line voltage value and the preset system parameter to obtain a filtered output line voltage value; and obtaining a voltage peak balance degree and a phase angle offset of the three-phase power grid based on the filtered output line voltage value.

In one embodiment, the computer programs are configured to be executed to implement the following steps: obtaining a voltage peak value; and a phase voltage value, a phase angle value and a phase voltage peak value of a phase corresponding to the filtered output line voltage value, based on the filtered output line voltage value; and obtaining a voltage peak balance degree based on the voltage peak value and the phase voltage peak value; and obtaining a phase angle offset based on the phase voltage value, the phase voltage peak value and the phase angle value.

In one embodiment, the computer programs are configured to be executed to implement the following steps: performing filter analysis based on the first-phase line voltage value and the preset system parameter to obtain a first-phase filtered output line voltage value; and performing filter analysis based on the second-phase line voltage value and the preset system parameter to obtain a second-phase filtered output line voltage value.

In one embodiment, the computer programs are configured to be executed to implement the following steps: obtaining a phase angle value of a phase corresponding to the first-phase filtered output line voltage value based on the first-phase filtered output line voltage value; performing derivation to the first-phase filtered output line voltage value to obtain a processed first-phase filtered output line voltage value after derivation; obtaining a phase voltage peak value of a phase corresponding to the first-phase filtered output line voltage value, and a voltage peak value, based on the first-phase filtered output line voltage value and the processed first-phase filtered output line voltage value; and obtaining a phase voltage value of a phase corresponding to the first-phase filtered output line voltage value based on the voltage peak value and the second-phase filtered output line voltage value.

In one embodiment, the computer programs are configured to be executed to implement the following steps: producing a detection result indicating an unbalanced three-phase power grid, once the voltage peak balance degree is not equal to 1 or the phase angle offset is not equal to 0; and producing a detection result indicating a balanced three-phase power grid, once the voltage peak balance degree is equal to 1 and the phase angle offset is equal to 0.

Those of ordinary skill in the art can understand that all or part of the processes in the methods of the above embodiments can be implemented by instructing relevant hardware through computer programs which can be stored in a non-volatile computer-readable storage medium. When the computer programs are executed, the processes of the above-mentioned method embodiments may be implemented. Any reference to memory, storage, database or other media used in the various embodiments provided in this application may include at least one of non-volatile and volatile memory. Non-volatile memory may include read-only memory (ROM), magnetic tape, floppy disk, flash memory, or optical memory, and the like. Volatile memory may include random access memory (RAM) or external cache memory. As an illustration rather than a limitation, the RAM may be in various forms, such as static random access memory (SRAM), dynamic random access memory (DRAM), synchronous dynamic random access memory (SDRAM), double data rate synchronous dynamic random access memory (DDRSDRAM), enhanced synchronous dynamic random access memory (ESDRAM), synchlink dynamic random access memory (SLDRAM), memory bus (Rambus) direct random access memory (RDRAM), direct memory bus dynamic random access memory (DRDRAM), and memory bus dynamic random access memory (RDRAM) and so on.

In the computer device and the computer-readable storage medium mentioned above, the line voltage values of the three-phase power grid can be obtained in real time by the voltage collector connected to the phase line of the three-phase power grid during the operation, the line voltage values obtained in real time and the preset system parameter are analyzed to a voltage peak balance degree and a phase angle offset of the three-phase power grid, and a fault diagnosis result is finally obtained based on the voltage peak balance degree and the phase angle offset. In such a way, a real-time diagnosis operation for judging whether the three-phase power grid is balanced can be realized, through the online calculation and analysis on the line voltage values, which has simple analysis operation to greatly reduce the system complexity. Meanwhile, the present device only adds one or more voltage collectors on the hardware, and no other hardware cost is increased. Moreover, strong diagnostic reliability is obtained in the present device.

The technical features in the above embodiments can be combined arbitrarily. For the sake of brevity, all possible combinations of the technical features in the above embodiments are not described, but should be considered to be the range described in this specification as long as there is no contradiction in the combination of these technical features.

The above-mentioned embodiments only represent several embodiments of the present application, and the descriptions thereof are relatively specific and detailed, but should not be construed as limiting the scope of the patent application. It should be pointed out that for those skilled in the art, several modifications and improvements can be made without departing from the concept of the present application, which all belong to the protection scope of the present application. Therefore, the scope of protection of the patent of the present application shall be subject to the appended claims.

What is claimed is:

1. A fault diagnosis method for a three-phase power grid, comprising:
   acquiring line voltage values of the three-phase power grid, wherein the line voltage values are collected and sent in real time by a voltage collector connected to a phase line of the three-phase power grid;
   obtaining a voltage peak balance degree and a phase angle offset of the three-phase power grid based on the line voltage values and a preset system parameter; and
   obtaining a fault diagnosis result based on the voltage peak balance degree and the phase angle offset;
   wherein said obtaining a voltage peak balance degree and a phase angle offset of the three-phase power grid based on the line voltage values and a preset system parameter comprises:
   performing filtering analysis based on the line voltage values and the preset system parameter to obtain a filtered output line voltage value; and
   obtaining a voltage peak balance degree and a phase angle offset of the three-phase power grid based on the filtered output line voltage value.

2. The fault diagnosis method as claimed in claim 1, wherein the line voltage values comprise at least two of a first-phase line voltage value corresponding to a first phase, a second-phase line voltage value corresponding to a second phase, and a third-phase line voltage value corresponding to a third phase in the three-phase power grid.

3. The fault diagnosis method as claimed in claim 1, wherein said obtaining a voltage peak balance degree and a phase angle offset of the three-phase power grid based on the filtered output line voltage value comprises:
   obtaining a voltage peak value; and a phase voltage value, a phase angle value and a phase voltage peak value of a phase corresponding to the filtered output line voltage value, based on the filtered output line voltage value;
   obtaining a voltage peak balance degree based on the voltage peak value and the phase voltage peak value; and
   obtaining a phase angle offset based on the phase voltage value, the phase voltage peak value and the phase angle value.

4. The fault diagnosis method as claimed in claim 3, wherein the line voltage values comprise a first-phase line voltage value and a second-phase line voltage value, and said performing filtering analysis based on the line voltage value and the preset system parameter to obtain a filtered output line voltage value comprises:
   performing filter analysis based on the first-phase line voltage value and the preset system parameter to obtain a first-phase filtered output line voltage value; and
   performing filter analysis based on the second-phase line voltage value and the preset system parameter to obtain a second-phase filtered output line voltage value.

5. The fault diagnosis method as claimed in claim 4, wherein said obtaining a voltage peak value; and a phase voltage value, a phase angle value and a phase voltage peak value of a phase corresponding to the filtered output line voltage value, based on the filtered output line voltage value comprises:
   obtaining a phase angle value of a phase corresponding to the first-phase filtered output line voltage value based on the first-phase filtered output line voltage value;
   performing derivation to the first-phase filtered output line voltage value to obtain a processed first-phase filtered output line voltage value after derivation;
   obtaining a phase voltage peak value of a phase corresponding to the first-phase filtered output line voltage value, and a voltage peak value, based on the first-phase filtered output line voltage value and the processed first-phase filtered output line voltage value; and
   obtaining a phase voltage value of a phase corresponding to the first-phase filtered output line voltage value based on the voltage peak value and the second-phase filtered output line voltage value.

6. The fault diagnosis method as claimed in claim 1, wherein said obtaining a fault diagnosis result based on the voltage peak balance degree and the phase angle offset comprises:
   producing a detection result indicating an unbalanced three-phase power grid, once the voltage peak balance degree is not equal to 1 or the phase angle offset is not equal to 0; and
   producing a detection result indicating a balanced three-phase power grid, once the voltage peak balance degree is equal to 1 and the phase angle offset is equal to 0.

7. A fault diagnosis apparatus for a three-phase power grid, comprising:
- a voltage acquisition module, configured to acquire line voltage values of the three-phase power grid, wherein the line voltage values are collected and sent in real time by a voltage collector connected to a phase line of the three-phase power grid;
- a parameter analysis module, configured to obtain a voltage peak balance degree and a phase angle offset of the three-phase power grid based on the line voltage values and a preset system parameter; and
- a fault analysis module, configured to obtain a fault diagnosis result based on the voltage peak balance degree and the phase angle offset.

8. A computer device, comprising a memory and a processor, the memory being stored with computer programs, the processor being configured to execute the computer programs to implement steps of the method according to claim 1.

\* \* \* \* \*